US006486003B1

United States Patent
Fjelstad

(10) Patent No.: US 6,486,003 B1
(45) Date of Patent: Nov. 26, 2002

(54) EXPANDABLE INTERPOSER FOR A MICROELECTRONIC PACKAGE AND METHOD THEREFOR

(75) Inventor: Joseph Fjelstad, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/520,320

(22) Filed: Mar. 7, 2000

Related U.S. Application Data

(63) Continuation of application No. 08/988,097, filed on Dec. 10, 1997, now abandoned.
(60) Provisional application No. 60/032,870, filed on Dec. 13, 1996.

(51) Int. Cl.[7] .................. H01L 21/44; H01L 21/48; H01L 21/50
(52) U.S. Cl. ....................... 438/117; 438/118
(58) Field of Search .................. 438/117, 118, 438/FOR 372, FOR 342, FOR 409

(56) References Cited

U.S. PATENT DOCUMENTS

| | | | |
|---|---|---|---|
| 3,811,186 A | * | 5/1974 | Larnerd |
| 4,545,610 A | * | 10/1985 | Lakritz |
| 4,878,611 A | * | 11/1989 | LoVasco |
| 5,148,265 A | | 9/1992 | Khandros et al. |
| 5,148,266 A | | 9/1992 | Khandros et al. |
| 5,390,844 A | | 2/1995 | Distefano et al. |
| 5,398,863 A | | 3/1995 | Grube et al. |
| 5,491,302 A | | 2/1996 | Distefano et al. |
| 5,536,909 A | | 7/1996 | DiStefano et al. |
| 5,659,952 A | | 8/1997 | Koyac et al. |
| 5,777,386 A | * | 7/1998 | Higashi |

* cited by examiner

Primary Examiner—David E. Graybill
(74) Attorney, Agent, or Firm—Lerner, David, Littenberg, Krumholz & Mentlik, LLP

(57) ABSTRACT

A method of fabricating a microelectronic package comprising an expandable structure includes the steps of providing first and second microelectronic elements having electrically conductive parts, providing the expandable structure between the microelectronic elements, connecting the electrically conductive parts together so that the microelectronic elements are electrically interconnected, and expanding the expandable structure after the connecting step so that the microelectronic elements move away from one another. The expandable structure is more rigid before the expanding step and less rigid after the expanding step. During the expanding step, the expandable structure remains in contact with the microelectronic elements and the microelectronic elements remain electrically interconnected. A microelectronic package including an expandable structure is also disclosed.

47 Claims, 5 Drawing Sheets

EXPANDABLE INTERPOSER FOR A MICROELECTRONIC PACKAGE AND METHOD THEREFOR

CROSS-REFERENCE TO RELATED APPLICATIONS

This application is a continuation of U.S. Patent application Ser. No. 08/988,097, filed Dec. 10, 1997, abandoned.

This application claims benefit of U.S. Provisional Application Ser. No. 60/032,870 filed Dec. 13, 1996, the disclosure of which is incorporated by reference herein.

FIELD OF THE INVENTION

The present invention generally relates to microelectronic assemblies, and more specifically it relates to components which facilitate connections between a microelectronic element such as a semiconductor chip and external circuit elements.

BACKGROUND OF THE INVENTION

Connection components such as interposers and/or substrates are typically used in combination with microelectronic elements such as semiconductor chips to facilitate electrical interconnections between semiconductor chips and external circuit elements. The reliability of the entire circuit operation depends upon the electrical connections between the chip, the interposer and the external circuit elements.

Various attempts have been made to produce connections between the chip and the external circuit elements satisfying the above discussed requirements. For example, commonly assigned U.S. Pat. No. 5,148,265, the disclosure of which is incorporated herein by reference, discloses an advanced method for providing the connection between a semiconductor chip and external circuit elements. According to certain embodiments discussed in the '265 patent, a semiconductor chip is connected to a corresponding substrate through a dielectric interposer. The semiconductor chip has a plurality of peripheral contacts positioned in a peripheral area of a front surface thereof. The flat, flexible interposer is formed with a plurality of connecting terminals, each of which is connected to a bonding terminal adjacent the periphery of the interposer. The flexible interposer is supported by a compliant layer. The peripheral contacts of the semiconductor chip are connected to the terminals of the interposer by bonding a multiplicity of fine leads to the chip. In one embodiment, the lead-bonding operation uses fine wires which are bonded to bonding terminals on the periphery of the interposer and to the contacts of the chip. During a wire bonding operation, when downwardly directed forces are applied to the peripheral region of the interposer containing the bonding terminals, this area of the interposer flexes downwardly. The downward movement of the interposer in the area of the bonding terminals may impede the bonding of the wires and the bonding terminals.

Commonly assigned U.S. patent application Ser. No. 08/709,127, the disclosure of which is hereby incorporated by reference, discloses a structure for compliantly interconnecting semiconductor chips and supporting substrates while substantially obviating problems associated with thermal cycling. In one preferred embodiment, the semiconductor chip package includes a sheet-like substrate having one or more gaps extending from a first surface to a second surface of the substrate and conductive terminals which are contacted from the second surface of the substrate. The substrate further has conductive leads electrically connected to and extending from each terminal and across the one or more gaps. Each lead is connected to a bond pad on the opposite side of the gap so that each lead has an expansion section within the gap which is laterally curved with respect to the plane of the substrate. In certain preferred embodiments, the expansion sections laterally curve at least twice in opposite directions and in one particular embodiment creates substantially "S" shaped lead portions. This structure allows the package to compensate for coefficient of thermal expansion ("CTE") mismatch problems by the flexing and bending of the expansion sections of the leads within the one of more gaps. The expansion sections of the leads are typically encapsulated with a compliant encapsulant to provided added support for their bending and flexing motion during thermal cycling.

Commonly assigned U.S. patent application Ser. No. 08/516,645, filed Aug. 18, 1995, the disclosure of which is incorporated herein by reference, discloses a microelectronic assembly comprising an interposer having oppositely facing first and second surfaces, a connecting terminal region and a bonding terminal region. The interposer has connecting terminals on the second surface in the connecting terminal region and has bonding terminals in the bonding terminal region. The assembly also includes a microelectronic element such as a semiconductor chip or other element having a front surface and having contacts on the front surface. The interposer overlies the front surface of the semiconductor chip with the second surface of the interposer facing upwardly away from the chip and with the first surface facing downwardly toward the chip. The connecting terminals are movable relative to the chip in vertical directions, whereas the bonding terminals are supported against such vertical movement. The interposer preferably comprises a thin, flexible layer, and a compliant layer disposed between the flexible layer and the chip for movably supporting the connecting terminal region. The assembly according to this aspect of the invention desirably also includes a reinforcing structure for reinforcing the bonding terminal region of the flexible layer against vertical movement towards the semiconductor chip. Subassemblies according to this aspect of the invention can be subjected to a bonding operation, such as a wire bonding operation, in which flexible conductors such as bonding wires are connected between the bonding terminals and the contacts on the chip. Because the bonding terminal region is reinforced, the bonding operation can be conducted efficiently. However, the finished assembly still provides the benefits associated with a compliantly mounted interposer, including testability and compensation for thermal effects during operation.

In spite of the advanced methods for providing the connection between a semiconductor chip and external circuit elements, further improvements would be desirable.

SUMMARY OF THE INVENTION

One aspect of the present invention provides a method of fabricating a microelectronic package. A method in accordance with this aspect of the invention includes the steps of providing first and second microelectronic elements having electrically conductive parts, providing an expandable structure disposed between the microelectronic elements, connecting the electrically conductive parts of the microelectronic elements together so that the microelectronic elements are electrically interconnected and expanding the expandable structure after the connecting step whereby the expandable structure increases in size so that the microelectronic elements move away from one another during the expanding step. During the connecting step, one or more flexible wires or leads are provided for electrically interconnecting the conductive parts. After the connecting step, the leads preferably have sufficient slack therein so that the microelectronic elements remain electrically interconnected during the expanding step.

In certain preferred embodiments, the expandable structure comprises a thermoplastic film or thermoplastic elastomer and a foaming agent, such as a high temperature foaming agent. The foaming agent is preferably a high temperature foaming agent so that foaming is not inadvertently triggered during processing of the package elements. The expandable structure may also comprise polypropylene with a toluene sulfonyl semicarbazide or another high temperature foaming agent, such as 5-phenyl tetrazole. As will be explained in more detail below, the expandable structure is substantially rigid during the connecting step and substantially flexible or pliant after the expanding step. During the expanding step, a sufficient amount of heat is applied to the expandable structure so that the thermoplastic film or thermoplastic elastomer will soften and the foaming agent will vaporize, causing the thermoplastic film to foam and expand. As the expandable structure expands, platens are preferably abutted against external surface regions of the microelectronic elements to maintain substantial parallelism between the microelectronic elements and to control the overall thickness of the expandable structure. In one embodiment, a first platen is abutted against the rear face of a first microelectronic element and a second platen is abutted against a central region of a second microelectronic element. After the first and second platens are in place, heat is applied to the expandable structure and the expandable structure is expanded in a controlled manner so that the first and second microelectronic elements move away from one another. After the expanding step, the one or more leads connecting the microelectronic elements have one or more curves therein so that the leads are capable of flexing and bending during thermal expansion and contraction of the microelectronic package.

In certain preferred embodiments, the first microelectronic element comprises a semiconductor chip having a front face including contacts and a rear face opposite the front face and the second microelectronic element includes a substantially flexible connection component having a first surface facing toward the front face of the semiconductor chip and a second surface facing away from the semiconductor chip, wherein the connection component has conductive terminals at the second surface thereof. In other embodiments, the second microelectronic element may comprise a substantially rigid connection component. The expandable structure is disposed between and in contact with the front face of the semiconductor chip and the first surface of the connection component. However, the expandable structure may be disposed anywhere it is desirable to place a microelectronic element in contact with an expandable structure. The expandable structure may include a plurality of complaint pads, wherein the plurality of compliant pads define channels therebetween.

After the semiconductor chip and the connection component have been electrically interconnected by bonding the conductive wires or leads to the contacts on the chip and the terminals on the connection component and after the expandable structure has been expanded, a compliant filler, such as a curable silicone elastomer encapsulant is allowed to flow within the channels between the plurality of pads. The encapsulant is then subjected to a curing process, such as using energy or a curing agent. In certain preferred embodiments, the encapsulant will constitute the bulk of the compliant interface between the connection component and the semiconductor chip because the plurality of compliant pads comprise only about 15–35% of the volume between the chip and the connection component. Preferably the plurality of compliant pads and the curable elastomer encapsulant comprise materials having substantially similar coefficients of thermal expansion. In other words, it is preferable that the plurality of compliant pads and the encapsulant comprise a substantially homogenous structure in order to avoid either thermal mismatch problems and/or the development of voids within the semiconductor chip package. However, the specific properties of the plurality of compliant pads are not as critical as the properties of the encapsulant (because the pads comprises only 15–35% of the volume) so that the array of compliant pads may comprise a more diverse assembly of materials, such as silicones and epoxies, than is possible with the encapsulant.

The present invention incorporates the realization that when bonding the ends of conductive wires or leads to the electrically conductive parts of microelectronic elements, it is critical that the electrically conductive parts of the microelectronic elements remain stationary or stable, i.e., do not move during the bonding or connecting step. Thus, it is desirable that the microelectronic elements, and specifically the bonding regions bearing electrically conductive parts, remain substantially rigid and/or stationary during the bonding operation so that effective bonds may be formed. In order to insure stable or stationary bonding surfaces, an expandable structure is provided in contact with at least one of the microelectronic elements. In a first state, the expandable structure is substantially rigid so that the electrically conductive parts of the microelectronic element remain substantially stable. While the expandable structure and the electrically conductive parts are stable, the ends of the conductive wires or leads are bonded to the conductive parts of the microelectronic element. After reliable bonds have been formed, the expandable structure is expanded by applying heat thereto, thereby causing the expandable structure to expand in size. During the expansion step, the microelectronic elements move away from one another in at least one axial direction; however, the microelectronic elements remain interconnected because the wires or leads are flexible and have sufficient slack to account for expansion and contraction of the microelectronic elements. After expansion, the expandable structure is in a second state whereby the expandable structure is substantially compliant to provide a compliant interface between the semiconductor chip and an external circuit element, such as a printed circuit board, so that the semiconductor chip remains electrically connected to the printed circuit board during thermal cycling of the chip and the external circuit element.

In one embodiment of the present invention, the expandable structure is provided between a semiconductor chip and a substantially flexible connection component; however, it is also contemplated that the connection component may be substantially rigid. The semiconductor chip includes a front face having electrical contacts and a rear face. The connection component includes a first surface in contact with the expandable structure and a second surface bearing conductive terminals. Each conductive terminal includes a central terminal for interconnecting to an external circuit, a bonding terminal at a peripheral region of the connection component, and a terminal lead integrally connected at a first end to the central terminal and a second end to the bonding terminal. After the semiconductor chip and the connection component have been juxtaposed with one another, the expandable structure is assembled between the front face of the semiconductor chip and the first surface of the connection component. Next, electrically conductive wires are bonded to the bonding terminal on the connection component and the contact on the semiconductor chip for electrically interconnecting the connection component and the semiconductor chip. The substantially rigid state of the expandable structure retains the bonding terminals in a stationary position so the bonding terminals do not move during the bonding step. After the microelectronic elements are electrically interconnected, the expandable structure is expanded by applying heat thereto during which time the microelectronic elements move away from one another. Preferably the conductive wires are flexible and have sufficient slack so that the wires are not stretched tautly during the expansion step. Moreover, the wires have sufficient slack after the expansion step to account for thermal cycling of the semiconductor chip package and the external circuit elements. After the expansion step, an encapsulant may be applied over both the expanded structure and the conductive wires to protect the microelectronic package from contamination.

In another embodiment, a tape automated bonding type lead or electroformed type lead is used. In this embodiment, the interposer is a sheet-like dielectric film having first and second surfaces. The dielectric film has conductive terminals on its second surface and flexible leads extending from the conductive terminals for electrically connecting the terminals to contacts on a semiconductor chip. The dielectric film has bond windows for accessing the flexible leads while electrically connecting the leads with the contacts. The leads are integrally formed with the conductive terminals so that the leads are only bonded to the contacts on the semiconductor chip. After the bonding step, the expandable structure is expanded as described above. Preferably, the leads have sufficient slack so that the leads are not broken or stretched tautly during the expanding step. In the next stage of the process, a low elastic dielectric encapsulant, such as a liquid silicone rubber or other curable liquid elastomer, is allowed to flow between the dielectric film and the chip and around the expandable structure and the leads while the dielectric film and chip are compressed together or held in place. A mask or coverlay may be placed over the bond windows to prevent the encapsulant from flowing through the bond windows during the encapsulation process.

In a further embodiment of a method of fabricating a microelectronic package, the leads are connected to the first or non-external surface of a connection component and the contacts on the semiconductor chip. Preferably the connection component is flexible, as described above in relation to the previous embodiment. Because the leads are connected to the first surface of the connection component, there is little room to provide vertical slack in the leads and thus lateral slack is provided in the leads. This lateral slack allows the leads to expanded in a somewhat spring-like manner as the expandable structure is expanded and/or during thermal cycling of the semiconductor chip package.

In still another embodiment of a method of fabricating a microelectronic package, the semiconductor chip is assembled in a face up, back bonded configuration. In this particular embodiment, the expandable structure is disposed between a flexible or rigid substrate and the rear face of a semiconductor chip. One or more conductive wires are wire bonded between the contacts on the chip and the bonding pads on the substrate. Each bonded wire has an expansion zone including sufficient slack to maintain an electrical interconnection between the chip and the substrate during the expanding step. In certain preferred embodiments, the expandable structure comprises a plurality of compliant pads which define channels running through adjacent pads. The adjacent pads in the array of compliant pads are preferably spaced close enough together with provide adequate support for maintaining substantial parallelism between the chip and the substrate. Preferably, the plurality of pads are compliant subsequent to the expansion step. After the expansion step, a first encapsulant, such as a curable silicone elastomer, is disposed in the channels between adjacent pads. The package may then be entirely encapsulated with a second encapsulant so that the semiconductor chip, the wires and the expandable structure are all covered by the second encapsulant. In certain embodiments, the first encapsulant and the second encapsulant may comprise the same material and/or may be deposited at the same time.

A still further embodiment of the present invention includes a fan-out semiconductor chip package wherein the leads are connected to respective chip contacts and extend outwardly beyond the periphery of the chip to terminals on a second microelectronic element, such as a dielectric element. In this particular embodiment, the first microelectronic element comprises a semiconductor chip and a package element including a heat sink. The heat sink is in the form of an open shell having a base wall, a side wall projecting upwardly from the base wall around the periphery thereof, and a projecting region extending outwardly beyond the semiconductor chip. The rear face of the semiconductor chip is bonded to the base wall of the heat sink by a thermally conductive adhesive layer. An expandable structure is provided on top of the projecting region and the dielectric element is provided over the expandable structure. The dielectric element has a top surface including electrically conductive terminals which are distributed uniformly over the entire area of the top surface. The electrically conductive leads are bonded to the chip contacts in accordance with the processes described above and the expandable structure is then expanded in a controlled manner as discussed previously. The final assembly may also be encapsulated using the encapsulation processes described above.

The foregoing and other objects and advantages of the present invention will be better understood from the following detailed description of preferred embodiments taken together with the attached drawings.

DETAILED DESCRIPTION OF PREFERRED EMBODIMENT

Figure 1A:
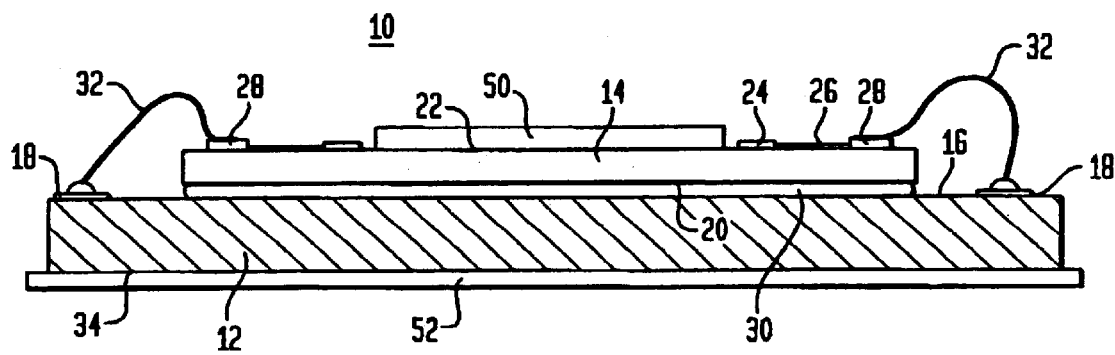
FIG. 1a is a side view of a semiconductor chip package including an expandable structure according to one embodiment of the present invention.

One embodiment of the present invention provides a method of making a semiconductor chip package 10 having an expandable structure. As shown in FIG. 1, a semiconductor chip 12 and a connection component 14 having electrically conductive parts are juxtaposed with one another before being bonded together to form a semiconductor chip package 10. The semiconductor chip 12 has a generally planer front face 16 including electrical parts or contacts 18 formed on peripheral regions of the front face 16. Other types of semiconductor chips may also be used, such as chips having contacts disposed in an "area array", i.e., an array covering substantially the entire front face of the chip with the contacts being uniformly spaced within the array. In the particular chip shown, the contacts 18 are arranged in rows (not shown) which are adjacent, and run parallel to each edge of the chip 12. The contacts 18 in each row are spaced at very close intervals, typically about 100 to about 250 micrometers center-to-center. This center-to-center spacing is adequate for high input/output "I/O" count chips used with wire bonding or tape automated bonding systems. The connection component 14 is a flexible sheet, such as a flexible dielectric sheet comprising polymeric material, and has a first or bottom surface 20, a second or top surface 22 and edges bounding the first surface 20 and the second surface 22; however, in other preferred embodiments the connection component 14 is substantially rigid. The connection component 14 also has a plurality of central terminals 24 distributed over the second surface 22. The terminals 24 are disposed at substantially even spaces on the second surface 22 so that the terminals 24 constitute an "area array." The number of central terminals 24 may be approximately equal to the number of peripheral contacts 18 on the semiconductor chip 12. Nonetheless, the center-to-center linear distance between adjacent ones of the central terminals 24 is substantially greater than the center-to-center distance between adjacent peripheral contacts 18 on the chip 12, because the central terminals 24 are substantially evenly distributed rather than concentrated in only a few rows. Each central terminal 24 is connected with a partial lead 26 and a bonding terminal 28, both of which are formed integrally with the central terminal 24. The bonding terminals 28 are arranged in rows adjacent the edges of the connection component 14. The central terminals 24, partial leads 26 and bonding terminals 28 may be formed from substantially any electrically conductive material, but preferably are formed from metallic material such as copper and copper alloys, noble metals and noble metal alloys. The central terminals 24 provide for attachment of the semiconductor chip package 10 to a printed circuit board ("PCB"), typically by means of conventional solder balls or non collapsing (solid core) solder balls. These components typically are fabricated by conventional photolithographic end etching or deposition techniques.

In the assembly method according to this embodiment of the invention, the connection component 14 is juxtaposed with the front face 16 of the chip 12 and an expandable structure 30 is disposed therebetween. In certain embodiments, the expandable structure 30 will first be attached to the first surface 20 of the connection component 14 and the expandable structure/connection component subassembly will then be aligned with and assembled to a central portion of the front face 16 of the semiconductor chip 12 so that the expandable structure 30 does not cover the contacts 18 on the chip 12. The expandable structure 30 may comprise any number of materials which can be attached or uniformly applied to the connection component 14 and which can expand to occupy several times its original volume. For example, one such expandable structure 30 comprises a thermoplastic film loaded with a foaming agent; however, it is also contemplated that other expandable materials such as urethanes, olefinic thermoplastic elastomers and other elastomeric alloys. Prior to the aforementioned expansion of the expandable structure 30, a conventional wire bonding machine is employed to bond the electrically conductive wires 32 between each chip contact 18 and a respective bonding terminal 28 on the second surface 22 of the connection component 14. Utilization of the wire bonding machine preferably leaves sufficient slack in the wires 32 so that after expansion of the expandable structure 30 the wires 32 are not broken or stretched.

In the particular embodiments shown in FIG. 1a, the conductive wires 32 are connected to the contacts 18 on the semiconductor chip 12 using a ball bond and the other ends of the conductive wires 32 are connected to the bonding terminals 28 using a wedge bond; however, other configurations can be used, e.g., wedge bonds at both ends of the conductive wire 32. The wire bonding step precedes the step of expanding the expandable structure 30 so that the bonding terminals 28 are stationary and/or stable when the ends of the electrically conductive wires 32 are bonded thereto. The term "stable" means that the bonding terminals 28 will remain essentially in one position during the bonding operation and will not move in either the vertical or the horizontal direction because, before the expanding step, the substrate and the expandable structure are substantially rigid. For example, if the bonding terminals 28 moved in the vertical direction during the bonding operation, then the positioning of the bonding wires 32 on the bonding terminals 28 would not be consistent and this may impede the formation of strong, reliable bonds.

Figure 1B:
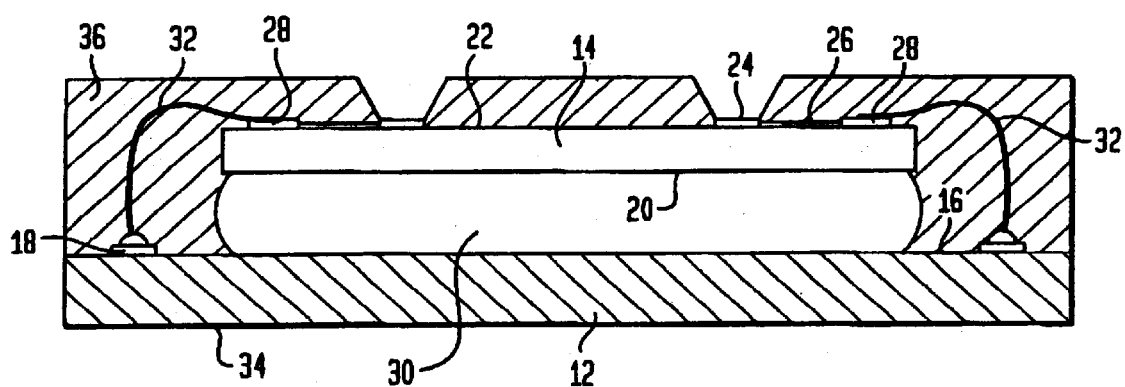
FIG. 1b shows the semiconductor chip package of FIG. 1a after the expandable structure has been expanded.

After the wire bonding step, the expandable structure 30, including the thermoplastic film and foaming agent, is exposed to sufficient heat so that the thermoplastic film will soften and the foaming agent will vaporize, thereby causing the thermoplastic film to foam and expand. Expansion of the expandable structure 30 causes the connection component 14 to move away from the chip 12, as shown in FIG. 1b. Preferably, the expandable structure 30 will be compliant or resilient after the expanding step. As shown in FIGS. 1a and 1b, the wires 32 interconnecting the chip 12 to the connection component 14 are provided with an expanding zone comprising excess slack to insure that the wires can flex and bend during the expanding step and so that the wires 32 are not stretched or pulled taut. In order to insure that semiconductor chip 12 and the connection component 14 are parallel to one another after the expanding step, platens may be abutted against external surface regions of the semiconductor chip 12 and the connection component 14. In one embodiment, a first platen 50 is abutted against the rear face 34 of the semiconductor chip 12 and a second platen 52 is abutted against a central region of the second surface 22 of the connection component 14. The perimeter of the second platen 52 is preferably bounded by the bonding terminals 28 so that the conductive wires 32 are not damaged. After the first and second platens 50, 52 are in place, heat is applied to the expandable structure 30 and the expandable structure 30 is expanded in a controlled manner so that the connection component 14 moves away from the semiconductor chip 12 and so that the connection component 14 and the chip 12 are substantially parallel to one another. In addition, the overall thickness of the expandable structure 30 may be controlled through use of the first and second platens 50, 52. For example, the platens may be pressed against the chip 12 and the connection component 14 to restrict expansion of the expandable structure during the expanding step.

In the next stage of the process, a low elastic modulus dielectric encapsulant or compliant filler material 36, such as a liquid silicone rubber or other curable liquid elastomer, is allowed to flow between the connection component 14 and the semiconductor chip 12 and around the expandable structure 30 and the conductive wires 32. The encapsulant 36 is then cured by energy such as heat, ultraviolet light or other radiant energy to form a substantially uniform, planer, compliant layer between the semiconductor chip 12 and the connection component 14. Because the encapsulant 36 is applied after the wire bonding operation, there is no risk of the encapsulant 36 coming in contact with the wires 32 or the electrically conductive parts of the chip 12 and the connection component 14 before the bonding step, which could diminish the strength of the bonds.

Figure 2A:
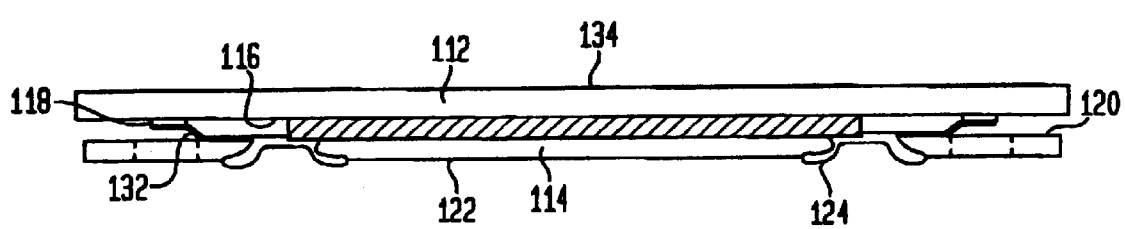
FIG. 2a shows a side view of a semiconductor chip package including an expandable structure according to another embodiment of the present invention.
Figure 2B:
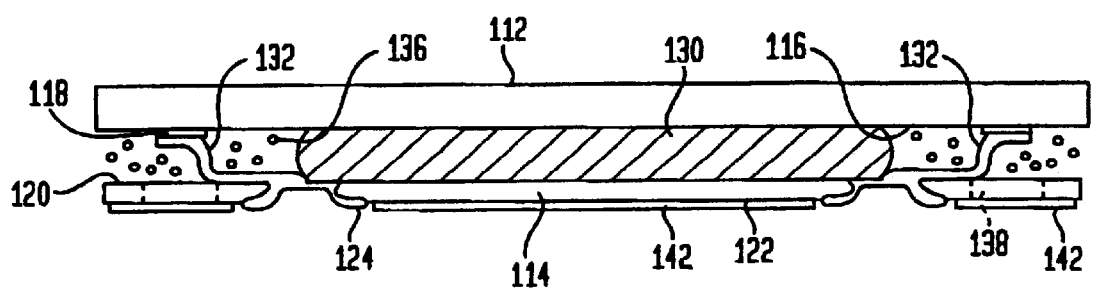
FIG. 2b shows the semiconductor chip package of FIG. 2a after the expandable structure has been expanded.

Referring to FIGS. 2a and 2b, in a method according to another embodiment of the invention, a tape automated bonding ("TAB") type lead or electroformed typed lead is used. In this embodiment, the connection component 114 is a sheet-like dielectric film having a first surface 120 and a second surface 122. The dielectric film 114 is preferably formed from a polymeric material, such as KAPTON™ (E) available from DuPont Chemical Corp. of an approximate thickness between 25 microns and 75 microns. The dielectric film 114 has conductive terminals 124 on its second surface 122, electrical parts or leads 132 extending from the terminals 124 for electrically connecting the terminals 124 to contacts 118 on a semiconductor chip 112, and bond windows for accessing the leads 132 while electrically connecting the leads 132 with the contacts 118. The leads 132 are typically lithographically defined on the dielectric film 114 to extend from the terminals 124. Thus, in this particular embodiment, the leads 132 are only bonded to the contacts 118 on the semiconductor chip 112 and are not bonded to the dielectric film 114.

After the expandable structure 130 has been assembled between the front face 116 of the semiconductor chip 112 and the first surface 120 of the dielectric film 114, each terminal 124 is connected with a contact 118 by bonding the leads 132 to the contacts 118. The terminals 124 and leads 132 may be formed from substantially any electrically conductive material 124, but preferably are formed from metallic materials such as copper and copper alloys, noble metals and noble metal alloys and are typically fabricated by conventional photolithographic end etching or deposition techniques. The leads 132 are electrically connected to the contacts 118 on the chip 112 by a conventional wire bonding operation, or by a bonding operation as shown in U.S. Pat. Nos. 5,398,863; 5,390,844; 5,536,909 and 5,491,302. Referring to FIG. 2b, after the electrically connecting step, the expandable structure 130 is subjected to heat so that the expandable structure expands as described above. During expansion, the leads 132 will bend and flex as the dielectric film 114 and the semiconductor chip 112 move away from one another; however, sufficient slack should remain in the leads 132 to account for thermal expansion differences between the semiconductor chip 114 and the dielectric film 114. First and second platens (not shown) may be abutted against the dielectric film 114 and the chip 112, respectively, to control expansion of the expandable structure 130 and to insure that the chip 112 and dielectric film 114 are substantially parallel to one another after the expanding step. Because the dielectric film 114 is a flexible substrate, when the first platen is abutted against the second surface 122 of the dielectric film 114, the platen may incorporate a vacuum to help insure that the dielectric film 114 is maintained parallel to the chip 112 during expansion of the expandable structure 130. In other embodiments, the dielectric 114 film may be maintained planar and parallel to the chip 112 by stretching the dielectric film 114 across a frame or a ring structure (not shown) prior to any of the above steps.

In the next stage of the process, a low elastic modulus dielectric encapsulant 136 or compliant filler material, such as a liquid silicone rubber or other curable liquid elastomer, is allowed to flow between the dielectric film 114 and the chip 112 and around the expandable structure 130 and the leads 132 while the chip 112 and dielectric film are compressed together or held in place. A mask or coverlay 142 may be placed over the bond windows 138 to prevent the encapsulant 136 from flowing through the bond windows 138 during the encapsulation process. The encapsulant 136 is then cured by energy such as heat, ultraviolet light or other radiant energy to form a substantially uniform, planer, compliant layer between the chip 112 and the dielectric sheet 114. Because the encapsulant 136 is applied after bonding, there is minimal risk of the encapsulant 136 coming in contact with the leads 132 or contacts 118 before bonding, which could diminish the strength of the bond.

Figure 3A:
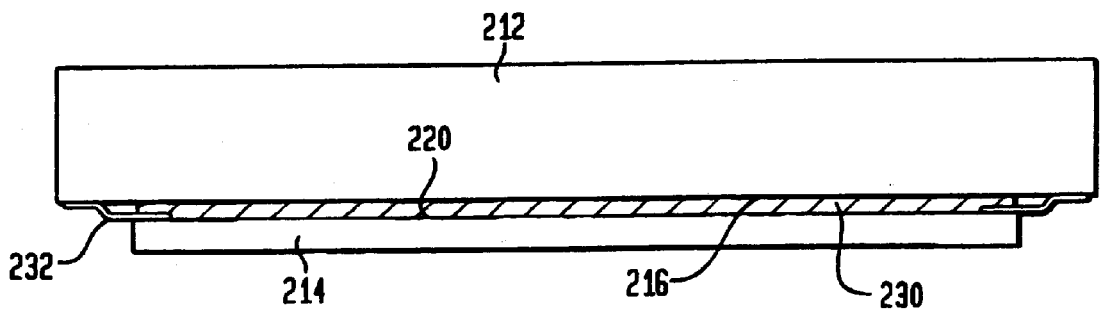
FIG. 3a shows a side view of a semiconductor chip package including an expandable structure according to a further embodiment of the present invention.
Figure 3B:
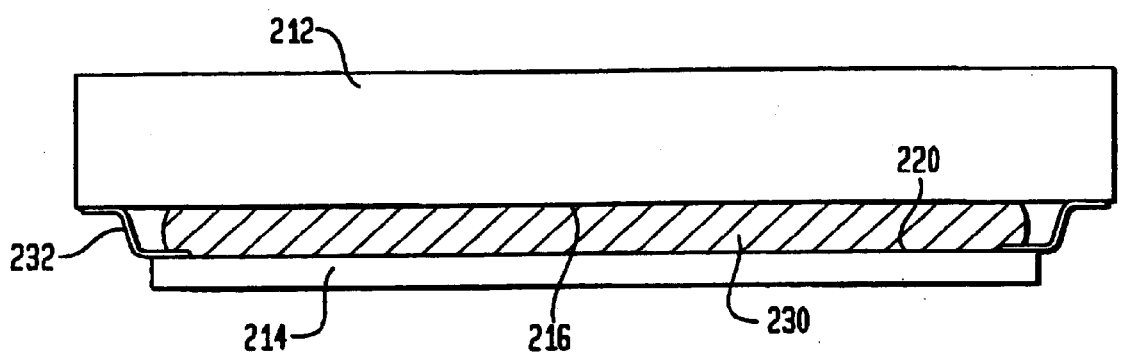
FIG. 3b shows a side view of the semiconductor chip package of FIG. 3a after the expandable structure has been expanded.
Figure 3C:
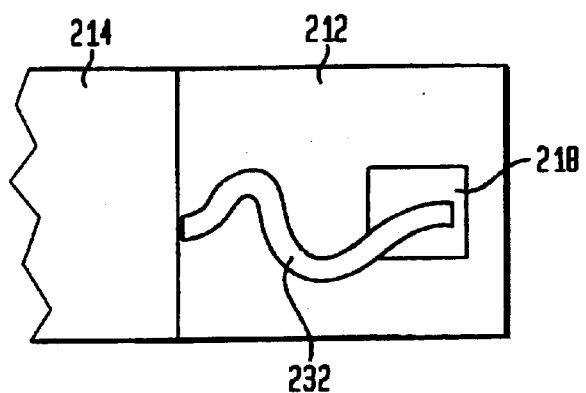
FIG. 3c shows a bottom view of the semiconductor chip package shown in FIG. 3b wherein a flexible lead is connected to a semiconductor chip and a substrate.

FIGS. 3a and 3b show a similar structure to that disclosed in FIGS. 2a and 2b; however, the particular embodiment shown in FIGS. 3a and 3b comprise leads 232 which are connected to a first surface 220 of a dielectric film 214, i.e., the non-exposed surface of the dielectric film 214. In accordance with this embodiment, a semiconductor chip 212 and the dielectric film 214 are juxtaposed with one another and an expandable structure 230 is assembled between the front face 216 of the semiconductor chip 212 and the first surface 220 of the dielectric film 214. The leads 232 are then bonded to the contacts 218 on the front face 220 of the semiconductor chip 214 using a conventional bonding technique. In this embodiment, since there is insufficient room to provide vertical slack in the lead 232, lateral slack is provided therein. Referring to FIG. 3c, each lead 232 has an expansion section extending from an edge of the dielectric film 214. The expansion sections are each bonded to a contact 218 on the semiconductor chip 212. Each expansion section is laterally curved substantially parallel to the plane of the dielectric film 214 prior to the bonding operation. Preferably, the expansion sections laterally curve at least twice in opposite directions (substantially "S" shaped) and may be curved more than twice. The laterally curved leads 232 extending between the terminals on the dielectric film 214 and the contacts 218 on the chip 212 create an expansion/contraction gap between the two microelectronic elements so that the expansion sections within the leads 232 may independently flex and bend during operational thermal cycling of the semiconductor chip package. The particular embodiment of leads 232 having lateral slack as shown in FIG. 3c is described in greater detail in U.S. patent application Ser. No. 08/709,127, which is incorporated by reference herein. The lateral slack in the lead 232 allows the lead 232 to expand in a somewhat spring-like manner as the expandable structure 230 is expanded. After the expanding step, an encapsulant 236 is allowed to flow between the dielectric film 214 and the semiconductor chip 212 and around the expandable structure 230 and the leads 232, in accordance with the processes described above.

Figure 4A:
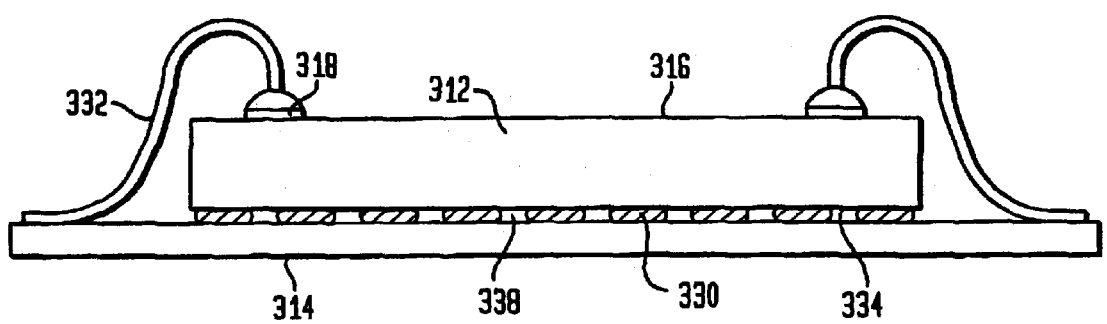
FIG. 4a shows a side view of a semiconductor chip package including an expandable structure according to yet another embodiment of the present invention.
Figure 4B:
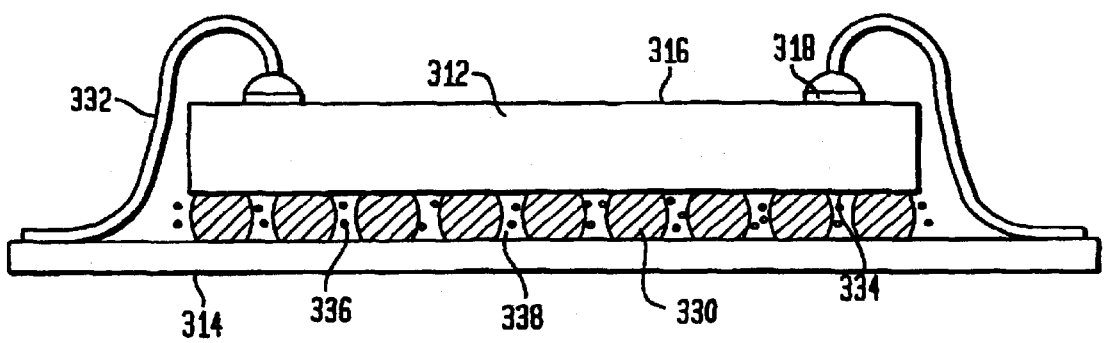
FIG. 4b shows the semiconductor chip package of FIG. 4a after the expandable structure has been expanded.

Referring to FIGS. 4a and 4b, in a method according to another embodiment of the invention, an expandable structure 330 is disposed between a substrate 314, such as a printed circuit board or a rigid connection component, and the rear face 334 of a semiconductor chip 312, i.e., the face of the semiconductor chip 312 opposite the front face 316 bearing contacts 318. In this embodiment, the expandable structure 330 comprises a plurality or array of pads (i.e., a matrix of dots), whereby any two adjacent pads 330 define a channel 338 therebetween. The channels 338 running between adjacent pads are between 75 to 100 microns wide, so that an encapsulant 336, such as a curable silicone elastomer, may flow freely therethrough. The array of pads 330 shown in FIGS. 4a and 4b are described in greater detail in U.S. patent application Ser. No. 08/365,699 entitled "Compliant Interface for a Semiconductor Chip and Method Therefore", filed Dec. 29, 1994, the disclosure of which is incorporated herein by reference. Preferably the array of pads 330 are spaced close enough together so that adequate support is provided for maintaining substantial parallelism between the chip 312 and the substrate 314. In addition, the pads 330 should be far enough apart so that the channels 338 are sufficiently wide after the pads 330 have been expanded for allowing the encapsulant 336 to flow within the channels 338. In certain embodiments, the pads 330 comprise a thermoplastic film and a foaming agent. Upon application of a sufficient amount of heat, the thermoplastic film will soften and the foaming agent will vaporize, causing the array of pads 330 to expand to the configuration shown in FIG. 4b. During the expansion step, the semiconductor chip 312 moves away from the substrate 314. However, the semiconductor chip 312 remains electrically interconnected to the substrate 314 because sufficient slack has been provided in the electrically conductive wires 332. After the expanding step, the pads 330 are preferably compliant or resilient for responding to thermal cycling differences between the semiconductor chip 312 and the substrate 314.

In other embodiments the expandable structure 330 may comprise a plurality of compliant pads connected by a web; a sheet having a plurality of compliant pads formed on opposite sides of the sheet; or a unitary structure having a square or rectangular shape. These various embodiments of the expandable structure 330 can be used in processes as described above, and in other processes for fabricating connection components or microelectronic packages. Further, the expandable structure according to the present invention may be stored and shipped with liner films applied to the surface regions thereof, as described in commonly assigned U.S. patent application Ser. No. 08/897,922, filed Jun. 20, 1997, the disclosure of which is hereby incorporated by reference herein.

In the next stage of the process, after expansion, a low elastic modulus dielectric encapsulant or compliant filler material 336, such as a liquid silicone elastomer or other curable liquid elastomer, is allowed to flow between the substrate 314 and the rear face 334 of the semiconductor chip 312 and within the channels 338. In one preferred embodiment, the encapsulant 336 is a curable silicone elastomer such as the silicone elastomer 577 manufactured by Dow Corning. The encapsulant 336 material flows within the channels 338 running between the array of pads 330 while the semiconductor chip 312 and the substrate 314 are compressed together or held in place. The encapsulant 336 is preferably substantially similar to the expandable material which forms the expandable structure 330 in order to provide a compliant interface having a more homogenous structure, thereby minimizing problems associated with thermal cycling. Further, the semiconductor chip package assembly is preferably entirely encapsulated with the encapsulant (not shown) so that the semiconductor chip 312, electrically conductive wires 332 and substrate 314 are all covered by a second encapsulant. The first encapsulant and the second encapsulant may comprise the same material and may be deposited at the same time. After the encapsulant 336 has been allowed to flow within the channels 338 between the chip 312 and around the conductive wires 332, the encapsulant 336 is cured by using energy such as heat, ultraviolet light or other radiant energy to form a substantially uniform, planar compliant layer between the semiconductor chip 312 and the substrate 314.

Figure 5A:
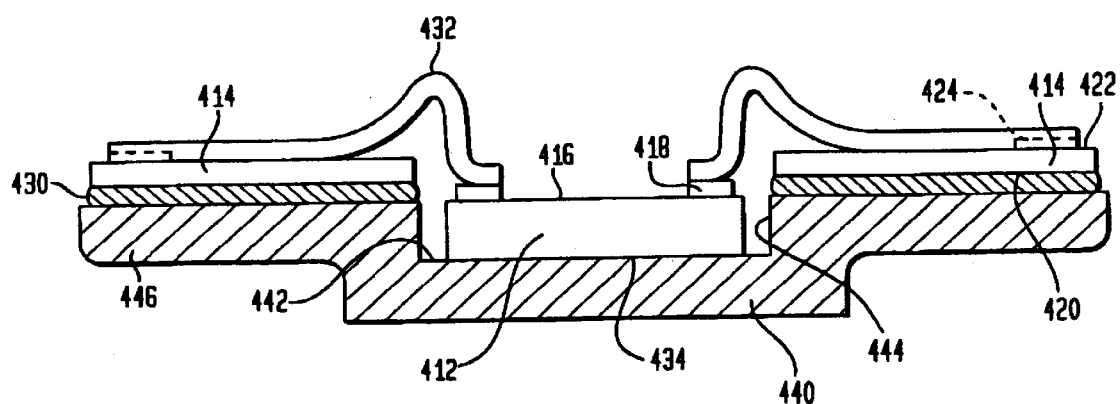
FIG. 5a shows a side view of a semiconductor chip package including an expandable structure according to still another embodiment of the present invention.
Figure 5B:
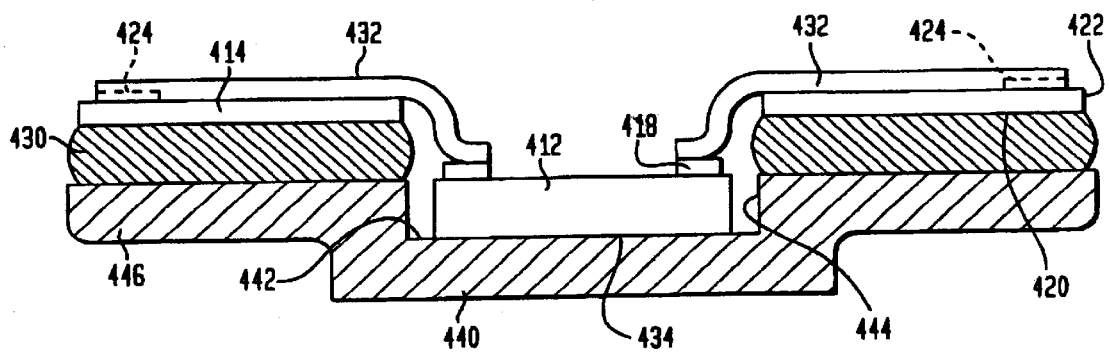
FIG. 5b shows a side view of the semiconductor package in FIG. 5a after the expandable structure has been expanded.

A still further embodiment of the present invention is shown in FIGS. 5a and 5b. This particular embodiment incorporates a fan-out semiconductor chip package whereby the leads 432 are connected to respective contacts 418 on a semiconductor chip 412 and extend outwardly beyond the periphery of the chip 412 to terminals on a substrate 414. A process in accordance with this particular embodiment of the present invention utilizes a semiconductor chip 412 having a front face 416 with contacts 418 thereon and having an oppositely facing rear surface 434. The particular chip illustrated in FIG. 5a has the contacts 418 disposed in an area array, i.e., an array covering substantially the entire front face 416 of the chip 412, with the contacts 418 being uniformly spaced within the array. The chip 412 is assembled in a package including a heat sink 440. The heat sink 440 is in the form of an open shell having a base wall 442, side walls 444 projecting upwardly from the base wall 442 around the periphery thereof, and a projecting region 446 extending outwardly from the side walls 444 and defining a generally planer surface remote from the base wall. The rear face 434 of the semiconductor chip 412 is bonded to the base wall 442 of the heat sink 440 by a thermally conductive adhesive layer. The adhesive layer may include any of the well known thermally conductive adhesive compositions, such as an epoxy loaded with metallic particles. The front face 416 of the chip 412 is substantially coplanar with the projecting regions 446 of the heat sink 440. Although gaps are shown between the edges of the chip 412 and the side walls 444 of the heat sink 440, it should be appreciated that the size of these gaps is exaggerated in the drawings for clarity of illustration. The projecting regions 446 of the heat sink 440 include a dielectric element 414 and an expandable structure 430 disposed between the dielectric element 414 and the projecting regions 446 of the heat sink 440. The dielectric element 414 includes a dielectric sheet incorporating one or more layers of a flexible, but substantially inextensible dielectric material. These flexible layers may include thin sheets of polyimide, typically having an aggregate thickness of about 25 microns (0.001 inch). The dielectric element 414 has a top surface 422, including electrically conductive terminals 424 which are distributed uniformly over the entire area of the top surface 422, and a bottom surface 420. The leads 432 are bonded to the chip contacts 418 in accordance with processes described above and the expandable structure 430 is then expanded in a controlled manner as described above. The final assembly may also be encapsulated using an encapsulant 436 as described above.

These and other variations and combinations of the features discussed above can be utilized without departing from the present invention as defined by the claims. For example, in other embodiments the foaming agent for expanding the substrate may be a chemically reactive material. In addition, the structures formed in accordance with the present invention may be as described in commonly assigned U.S. Pat. No. 5,148,265, the disclosure of which is incorporated by reference herein. Further, many microelectronic packages may be simultaneously manufactured using the processes described above. These packages are then separated from one another using a standard dicing technique and the individual semiconductor chip packages may then be attached to a supporting substrate such as a standard printed circuit board. Accordingly, the foregoing description of the preferred embodiments should be taken by way of illustration rather than by way of limitation of the invention.

I claim:

1. A method of fabricating a microelectronic package comprising the steps of:
   providing first and second microelectronic elements having electrically conductive parts, wherein said second microelectronic element includes conductive terminals and flexible conductive leads integrally connected to said terminals;
   providing an expandable structure disposed between said microelectronic elements;
   connecting said electrically conductive parts together using said flexible leads so that said microelectronic elements are electrically interconnected;
   expanding said expandable structure after the connecting step so that said microelectronic elements move away from one another, wherein said microelectronic elements remain electrically interconnected through said flexible leads during the expanding step, and wherein said expandable structure is more rigid during the connecting step and less rigid after the expanding step.

2. A method as claimed in claim 1, wherein said expandable structure comprises a thermoplastic material and a foaming agent.

3. A method of fabricating a microelectronic package comprising the steps of:
   providing first and second microelectronic elements having electrically conductive parts;
   providing an expandable structure disposed between said microelectronic elements;
   connecting said electrically conductive parts together so that said microelectronic elements are electrically interconnected;
   expanding said expandable structure after the connecting step so that said microelectronic elements move away from one another, wherein said microelectronic elements remain electrically interconnected during the expanding step, wherein the expanding step includes the step of heating said thermoplastic material and said foaming agent so that said thermoplastic film foams and expands.

4. A method as claimed in claim 1, wherein said expandable structure is in contact with said microelectronic elements during the expanding step.

5. A method as claimed in claim 1, wherein the connecting step includes attaching the ends of said one or more flexible conductive leads with the electrically conductive parts of at least one of said microelectronic elements.

6. A method as claimed in claim 5, wherein said one or more flexible leads comprise an expansion zone including slack so that said microelectronic elements remain electrically interconnected during the expanding step.

7. A method as claimed in claim 6, wherein after the expanding step said one or more flexible leads have one or more curves so that said leads are capable of flexing and bending in response to heating and cooling of said microelectronic package.

8. A method as claimed in claim 1, comprising the additional step of:
   maintaining substantial parallelism between said microelectronic elements during the expanding step.

9. A method as claimed in claim 8, wherein the maintaining substantial parallelism step comprises the steps of:
   abutting at least one platen against at least one of said microelectronic elements;
   controlling movement of said at least one of said microelectronic elements with said at least one platen so that said microelectronic elements are substantially parallel to one another after the expanding step.

10. A method as claimed in claim 5, wherein said expandable structure includes a plurality of pads, said plurality of pads defining channels therebetween.

11. A method as claimed in claim 10, further comprising the steps of:
    allowing a curable liquid to flow within said channels and around said leads after the expanding step;
    curing said curable liquid.

12. A method as claimed in claim 11, wherein said curable liquid includes a silicone elastomer.

13. A method as claimed in claim 1, wherein said first microelectronic element comprises a semiconductor chip having a front face including contacts and a rear face opposite said front face.

14. A method as claimed in claim 13, wherein said second microelectronic element includes a connection component having a first surface and a second surface and said conductive terminals on at least one of said surfaces.

15. A method as claimed in claim 14, wherein said expandable structure is in contact with the front face of said semiconductor chip and the first surface of said connection component.

16. A method as claimed in claim 15, wherein said connection component includes a substantially flexible dielectric sheet.

17. A method as claimed in claim 16, wherein said flexible dielectric sheet has a first surface and a second surface facing away from said semiconductor chip, said dielectric sheet further comprising said conductive terminals on the second surface including said flexible conductive leads integrally connected to said terminals.

18. A method as claimed in claim 17, wherein said leads are lithographically defined on said dielectric sheet and extend from said terminals beyond the periphery of the dielectric sheet.

19. A method as claimed in claim 18, wherein said leads are integrally connected to the first surface of said dielectric sheet.

20. A method as claimed in claim 15, wherein during the expanding step a first platen is in contact with the second surface of said connection component and a second platen is in contact with the rear face of said semiconductor chip.

21. A method as claimed in claim 14, wherein said expandable structure is in contact with the rear face of said chip and the second surface of said substrate.

22. A method as claimed in claim 1, wherein said first microelectronic element comprises a semiconductor chip and a package element having a projecting region extending outwardly beyond the chip, said expandable structure being disposed between said projecting region and said second microelectronic element.

23. A method as claimed in claim 22, wherein said package element includes a heat sink for dissipating heat from said semiconductor chip.

24. A method as claimed in claim 23 wherein said second element includes a flexible dielectric sheet.

25. A method as claimed in claims 23, wherein said dielectric sheet moves away from said package element in a controlled manner during the expanding step so that said chip and said dielectric sheet are substantially parallel to one another after the expanding step.

26. A method of fabricating a microelectronic package comprising the steps of:
   providing first and second microelectronic elements having electrically conductive parts;
   providing an expandable structure disposed between said microelectronic elements;
   connecting said electrically conductive parts together through conductive wires so that said microelectronic elements are electrically interconnected; and
   expanding said expandable structure after the connecting step so that said microelectronic elements move away from one another, wherein said microelectronic elements remain electrically interconnected through said conductive wires during the expanding step, and wherein said expandable structure is more rigid during the connecting step and less rigid after the expanding step.

27. A method as claimed in claim 26, wherein said expandable structure comprises a thermoplastic material and a foaming agent.

28. A method as claimed in claim 27, wherein the expanding step includes heating said thermoplastic material and said foaming agent so that said thermoplastic film foams and expands.

29. A method as claimed in claim 26, wherein said expandable structure is in contact with said microelectronic elements during the expanding step.

30. A method as claimed in claim 26, wherein said conductive wires have one or more curves so that said conductive wires are capable of flexing and bending in response to heating and cooling of said microelectronic package.

31. A method as claimed in claim 26, wherein said expandable structure includes a plurality of pads defining channels therebetween.

32. A method as claimed in claim 31, further comprising:
   allowing a curable liquid to flow within said channels after the expanding step;
   curing said curable liquid.

33. A method of fabricating a microelectronic package comprising the steps of:
   providing an expandable structure having a first volume;
   juxtaposing said expandable structure having a first volume between first and second microelectronic elements having electrically conductive parts and assembling said expandable structure with said first and second microelectronic elements;
   electrically interconnecting the conductive parts of said first and second microelectronic elements; and
   after the electrically interconnecting step, expanding said expandable structure to a second volume greater than the first volume thereof so that said first and second microelectronic elements move away from one another, wherein said first and second microelectronic elements remain electrically interconnected during the expanding step, and wherein said expandable structure is more rigid during the connecting step and less rigid after the expanding step.

34. A method as claimed in claim 33, wherein said expandable structure comprises a thermoplastic material and a foaming agent.

35. A method as claimed in claim 34, wherein the expanding step includes the step of heating said thermoplastic material and said foaming agent so that said thermoplastic film foams and expands.

36. A method as claimed in claim 33, wherein said expandable structure is in contact with said first and second microelectronic elements during the expanding step.

37. A method as claimed in claim 33, wherein the electrically interconnecting step includes:
   providing one or more flexible leads;
   attaching the ends of said one or more flexible leads with the electrically conductive parts of at least one of said microelectronic elements.

38. A method as claimed in claim 33, wherein the electrically interconnecting step includes:
   providing one or more conductive wires;
   attaching the ends of said one or more conductive wires with the electrically conductive parts of said microelectronic elements.

39. A method as claimed in claim 33, further comprising maintaining substantially parallelism between said microelectronic elements during the expanding step.

40. A method of fabricating a microelectronic package comprising:
   providing first and second microelectronic elements having electrically conductive parts;
   disposing an expandable structure between said first and second microelectronic elements, wherein said expandable structure includes an unactivated foaming agent;
   connecting said electrically conductive parts together so that said microelectronic elements are electrically interconnected; and
   after the connecting step, activating said foaming agent for expanding said expandable structure so that said microelectronic elements move away from one another, wherein said microelectronic elements remain electrically interconnected during the activating and expanding steps, and wherein the expanding step includes the step of heating said thermoplastic material and said foaming agent so that said thermoplastic film foams and expands.

41. A method as claimed in claim 40, wherein said activating and expanding steps occur simultaneously.

42. A method as claimed in claim 40, wherein said expandable structure is more rigid during the connecting step and less rigid after the connecting step.

43. A method as claimed in claim 40, wherein said expandable structure comprises a thermoplastic material and said foaming agent.

44. A method as claimed in claim 40, wherein said expandable structure is in contact with said first and second microelectronic elements during the expanding step.

45. A method as claimed in claim 40, wherein the electrically interconnecting step includes:
   providing one or more flexible leads;
   attaching the ends of said one or more flexible leads with the electrically conductive parts of at least one of said microelectronic elements.

46. A method as claimed in claim 40, wherein the electrically interconnecting step includes:
   providing one or more conductive wires;
   attaching the ends of said one or more conductive wires with the electrically conductive parts of said microelectronic elements.

47. A method as claimed in claim 40, further comprising maintaining substantially parallelism between said microelectronic elements during the expanding step.

* * * * *

UNITED STATES PATENT AND TRADEMARK OFFICE
CERTIFICATE OF CORRECTION

PATENT NO. : 6,486,003 B1
DATED : November 26, 2002
INVENTOR(S) : Joseph Fjelstad It is certified that error appears in the above-identified patent and that said Letters Patent is hereby corrected as shown below:

Column 4,
Line 16, "comprises" should read -- comprise --.

Column 5,
Line 55, "expanded" should read -- expand --.
Line 60, "face up" should read -- face-up --; and "back bonded" should read -- back-bonded --.

Column 6,
Line 5, "with" should read -- to --.

Column 9,
Line 23, "planer" should read -- planar --.

Column 10,
Line 5, "114" should read -- 112 --.
Line 31, "planer" should read -- planar --.
Line 39, "comprise" should read -- comprises --.

Column 12,
Line 41, "planer" should read -- planar --.

Column 15,
Line 3, "claims" should read -- claim --.

Column 16,
Lines 20 and 64, "substantially" should read -- substantial --.

Signed and Sealed this

Eighteenth Day of March, 2003

JAMES E. ROGAN
*Director of the United States Patent and Trademark Office*